(12) United States Patent
Gailhard

(10) Patent No.: US 11,671,078 B2
(45) Date of Patent: Jun. 6, 2023

(54) CLOCK SIGNAL GENERATION

(71) Applicant: STMicroelectronics (Rousset) SAS, Rousset (FR)

(72) Inventor: Bruno Gailhard, Peypin (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 17/520,063

(22) Filed: Nov. 5, 2021

(65) Prior Publication Data
US 2022/0158628 A1    May 19, 2022

(30) Foreign Application Priority Data

Nov. 16, 2020  (FR) ...................................... 2011735

(51) Int. Cl.
| | | |
|---|---|---|
| H03K 3/03 | (2006.01) | |
| H03K 5/26 | (2006.01) | |
| H03L 7/093 | (2006.01) | |
| H03L 7/099 | (2006.01) | |
| G06F 1/06 | (2006.01) | |
| G06F 1/08 | (2006.01) | |
| H03K 5/00 | (2006.01) | |

(52) U.S. Cl.
CPC ............. *H03K 3/0315* (2013.01); *G06F 1/06* (2013.01); *G06F 1/08* (2013.01); *H03K 5/00006* (2013.01); *H03K 5/26* (2013.01); *H03L 7/093* (2013.01); *H03L 7/0995* (2013.01)

(58) Field of Classification Search
CPC .... H03K 3/0315; H03K 5/00006; H03K 5/26; G06F 1/06; G06F 1/08; G06F 1/04; G06F 1/12; G06F 1/10; H03L 7/093; H03L 7/0995; H03L 7/18; H03L 7/08; H03L 7/00; H03L 1/00; H03L 7/07; H03L 7/06; H03L 7/099; H03F 3/45192; H03F 3/45475; H03F 2203/45192

See application file for complete search history.

(56) References Cited

U.S. PATENT DOCUMENTS

| | | | | |
|---|---|---|---|---|
| 7,321,254 B2 * | 1/2008 | Li | ........................ | H03K 3/0315 327/513 |
| 2005/0099235 A1 * | 5/2005 | Sakamoto | ............... | H03L 7/103 331/16 |
| 2019/0052280 A1 * | 2/2019 | Perez | .................... | H03L 7/0995 |

FOREIGN PATENT DOCUMENTS

| | | |
|---|---|---|
| EP | 1 246 356 | 10/2002 |
| EP | 1 324 491 | 7/2003 |

* cited by examiner

*Primary Examiner* — John W Poos
(74) *Attorney, Agent, or Firm* — Seed Intellectual Property Law Group LLP

(57) ABSTRACT

A device for generating first clock signals includes first circuits, each including a ring oscillator delivering one of the first clock signals and being connected to a first node configured to receive a first current. A circuit selects one the first clock signals, and a phase-locked loop delivers a second signal which is a function of a difference between a frequency of the first selected clock signal and a set point frequency. Each first circuit supplies the first node with a compensation current determined by the second signal, when this first circuit delivers the selected clock signal and operates in controlled mode.

20 Claims, 2 Drawing Sheets

Figure 1:
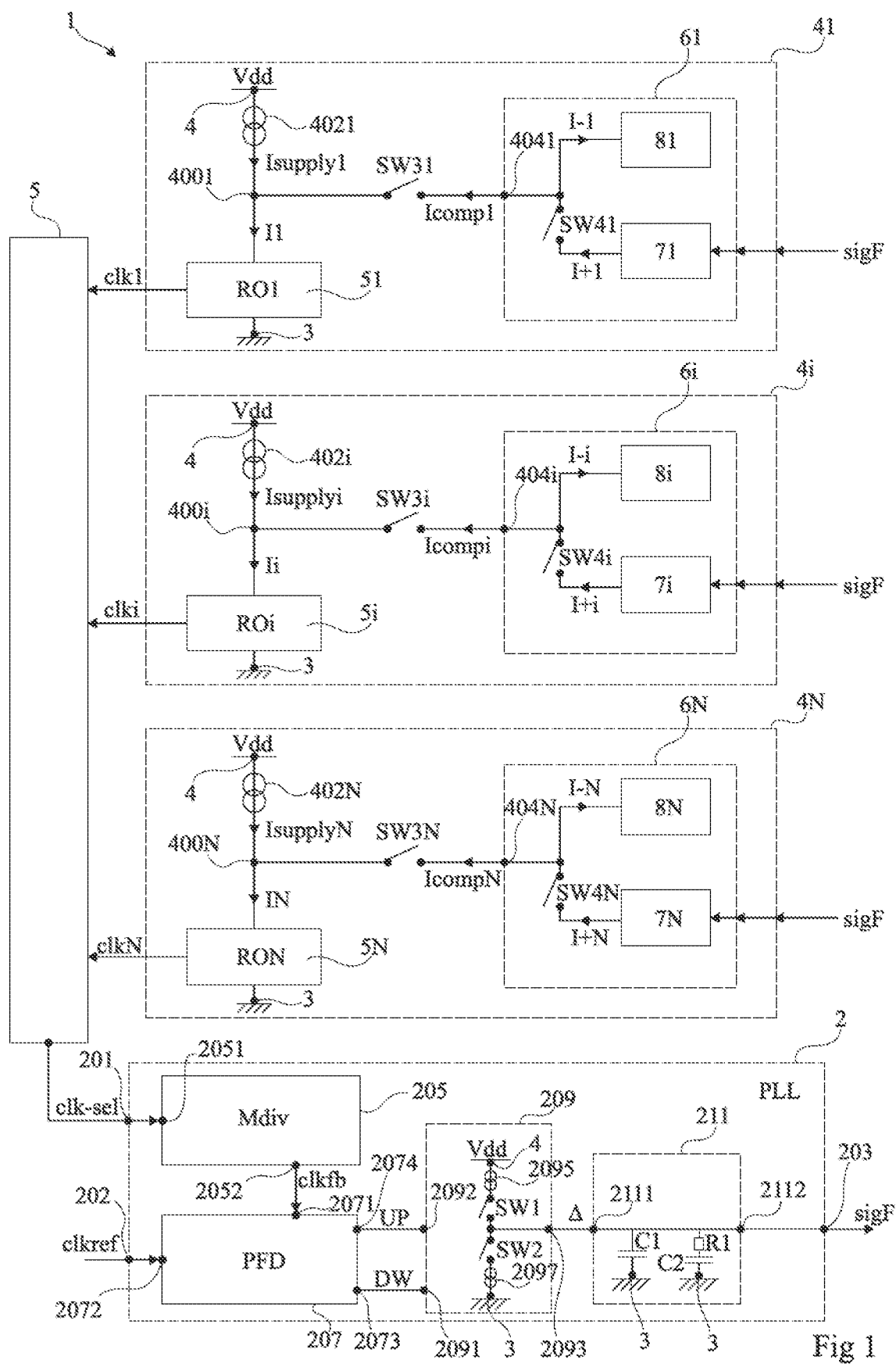

CLOCK SIGNAL GENERATION

BACKGROUND

Technical Field

The present disclosure generally concerns electronic circuits, and more particularly the generation of a plurality of clock signals at different frequencies in such electronic circuits.

Description of the Related Art

Electronic clock generation circuits are known. For example, clock generation circuits currently called RC oscillators are known. In an RC oscillator, a voltage ramp, available across a capacitive element charged by a charge current, is compared with a reference voltage. At each crossing of the reference voltage by the voltage ramp, the latter is reset, after which a new voltage ramp is compared again with the reference voltage. The comparison is implemented by a comparator, typically a comparator-assembled operational amplifier. In such a circuit, the output signal of the comparator is used, for example, after having been shaped, as a clock signal. The frequency of the clock signal thus generated is then determined by the value of the capacitance, of the charge current of the capacitive element, and of the reference voltage.

When it is desired to generate a plurality of clock signals at different frequencies, it is for example provided for each clock signal to be generated by a corresponding RC oscillator.

Known clock generation circuits, particularly the above-described RC oscillators, have various disadvantages.

For example, the above-described RC oscillators are relatively power intensive due to the fact that a capacitive element has to be repeatedly charged. Thus, RC oscillators are not adapted to so-called "low-power" applications or electronic circuits, where the electric power consumption is desired to be decreased. This is all the truer when a plurality of clock signals are desired to be generated at different frequencies, due to the fact that a plurality of capacitive elements, typically at least one per generated clock signal, must then be repeatedly charged.

BRIEF SUMMARY

Electronic clock generation circuits are known.

There for example is a need for a circuit for generating a plurality of clock signals which consumes less than a circuit for generating a plurality of clock signals implemented by RC oscillators.

There for example is a need for a circuit for generating a plurality of clock signals where the frequency of any of the generated clock signal can be controlled in a controlled operating phase, and non-controlled in a non-controlled operating phase, so that the frequency of this signal is more accurate than in non-controlled operating phase.

An embodiment overcomes all or part of the disadvantages of known clock signal generation device or circuits.

An embodiment overcomes all or part of the disadvantages of known clock signal generation methods.

An embodiment provides a device for generating a plurality of first clock signals, the device comprising:

first circuits, each comprising a ring oscillator configured to deliver one of said plurality of first clock signals, the oscillator being connected to a first node configured to receive a first current, a circuit configured to receive the first clock signals and to deliver a first clock signal selected from among the first clock signals; and a phase-locked loop configured to deliver a second signal varying according to a difference between a frequency of the first selected clock signal and a set point frequency determined by a frequency of a third signal which is a clock signal received by the phase-locked loop, wherein each first circuit is configured to supply the first node with a compensation current determined by the second signal, when this first circuit delivers the first selected clock signal and this first circuit operates in a mode controlled by the phase-locked loop.

According to an embodiment, each first circuit comprises:
a first current source configured to supply the first current to the first node;
a second node coupled to the first node;
a second circuit configured to supply, to the second node, a second current determined by the second signal; and
a third circuit configured to draw a third current from the second node.

According to an embodiment, in each first circuit:
the first current source is configured so that the first current is equal to Ki times a reference current Iref;
the second circuit is configured so that the second current is equal to Ki times B times a fourth current identical for all the first circuits, B being a factor determined by the second signal; and
the third circuit is configured so that the third current is equal to Ki times A times a fifth current identical for all the first circuits and proportional to reference current Iref.

According to an embodiment, each third circuit comprises a current mirror comprising an input branch and at least one output branch associated with said input branch, said at least one output branch being configured to deliver the third current.

According to an embodiment, in each third circuit, the input branch of said current mirror comprises a generator of the fifth current.

According to an embodiment, the input branch of said current mirror of each third circuit is common to all the third circuits.

According to an embodiment, in each third circuit, said at least one output branch comprises a circuit controllable to modify a value of factor A.

According to an embodiment, each second circuit comprises a current mirror comprising an input branch and at least one output branch associated with said input branch, said at least one output branch being configured to deliver the second current.

According to an embodiment, in each second circuit, said input branch is controlled by the second signal and is configured so that a sixth current equal to B times the fourth current flows therein.

According to an embodiment, in each second circuit, said input branch comprises a voltage-to-current converter controlled by the second signal.

According to an embodiment, the voltage-to-current converter comprises a transistor in series with a resistor, said transistor being controlled by the second signal.

According to an embodiment, the input branch of the current mirrors of the second circuits is common to all the second circuits.

According to an embodiment, the phase-locked loop comprises:
a frequency divider programmable according to the first selected signal and configured to receive the first selected signal and to deliver a periodic signal at a frequency divided with respect to a frequency of the first selected signal;

a phase comparator configured to deliver a first binary signal indicating when the periodic signal is phase-lagged with respect to the second clock signal and a second binary signal indicating when the periodic signal is phase-advanced with respect to the second clock signal;

a charge pump controlled by the first and second binary signals and configured to deliver a signal varying according to the phase difference between the periodic signal and the second clock signal; and a filter configured to deliver the second signal based on the signal delivered by the charge pump.

An embodiment provides a method of generation of a plurality of first clock signals comprising the steps of:

selecting, by means of a selection circuit, one of the first signals;

delivering, by means of a phase-locked loop, a second signal varying according to a difference between the frequency of the first selected signal and a set point frequency of the first selected signal;

for each of said one or a plurality of first clock signals, supplying a first current to a first node of a first corresponding circuit, each first circuit comprising a ring oscillator connected to the first node and delivering one of said first clock signals; and supplying the first node of the first circuit delivering the first selected signal, by means of said first circuit, with a compensation current determined by the second signal, only when said first circuit operates in a mode controlled by the phase-locked loop.

According to an embodiment, the method is implemented by the described device.

According to an embodiment, the method comprises, for each first circuit, a determination of a calibrated value of the factor A of the third circuit of said first circuit, the determination of the calibrated value comprising:

selecting, by means of the selection circuit, the first clock signal of said first circuit;

reprogramming the frequency divider to take into account the variations of the temperature and of the power supply voltage of the device on the frequency of the first selected clock signal;

drawing the third current from the first node and increasing the value of factor A by controlling said at least one output branch of the third circuit; and for each value of factor A, resetting the frequency divider and determining whether the periodic signal is phase advanced or lagged with respect to the second clock signal based on the first and second binary signals, the calibrated value of factor A being the first value of factor A for which:

the periodic signal becomes phase-lagged with respect to the second signal in a case where the second and third currents are positive in controlled mode; or the periodic signal becomes phase-advanced with respect to the second signal in a case where the second and third currents are negative in controlled mode.

BRIEF DESCRIPTION THE SEVERAL VIEWS OF THE DRAWINGS

Figure 2:
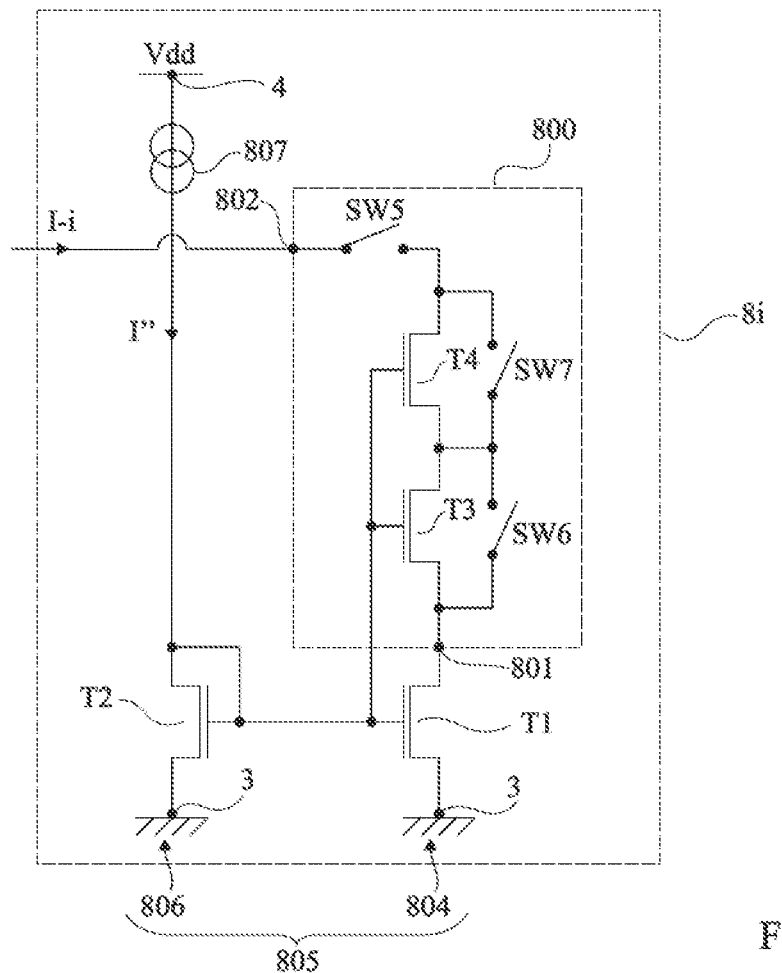
Figure 3:
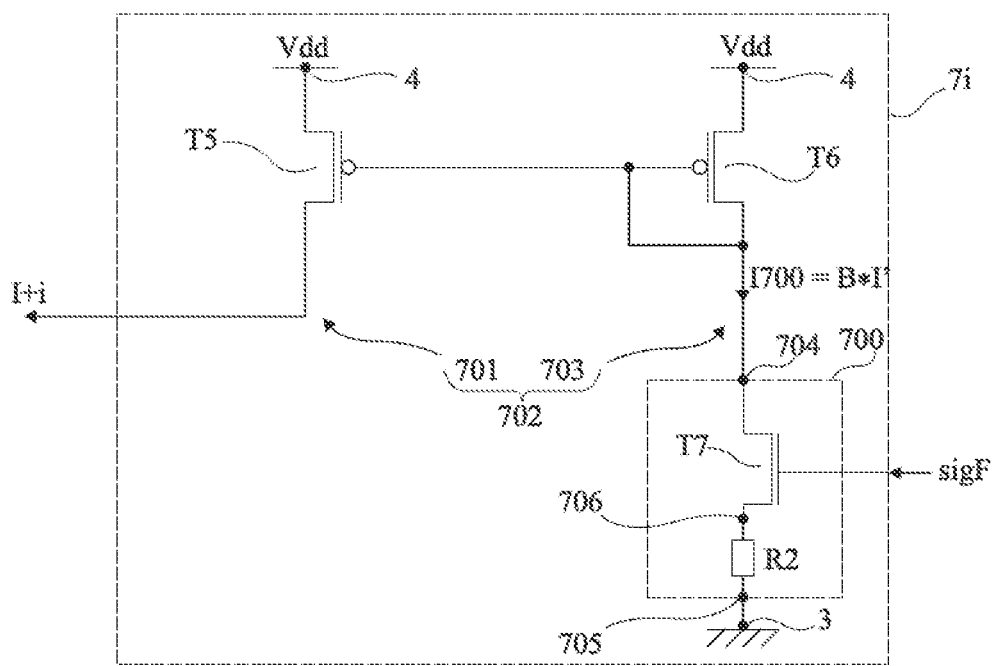

The foregoing features and advantages, as well as others, will be described in detail in the following description of specific embodiments given by way of illustration and not limitation with reference to the accompanying drawings, in which:

FIG. 1 schematically shows, partly in the form of blocks, an embodiment of a device for generating a plurality of clock signals;

FIG. 2 schematically shows an embodiment of a circuit of the device of FIG. 1; and FIG. 3 schematically shows an embodiment of another circuit of the device of FIG. 1.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the various usual electronic circuits, particularly integrated, and usual applications where a device or circuit for generating one or a plurality of clock signals may be provided have not been detailed, the described embodiments being compatible with these usual circuits and applications. Similarly, the current uses of a clock signal have not been detailed, these current uses being compatible with the described embodiments.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the following description, a current is said to be drawn from a node when the current comes out of the node and is said to be supplied to a node when the current flows towards the node, notwithstanding the fact that the current may be positive or negative.

FIG. 1 schematically shows, partly in the form of blocks, an embodiment of a device 1 for generating a plurality of clock signals clki, i being an integer index in the range from 1 to N. The generated signals clki preferably have different frequencies.

Device 1 comprises a signal selection circuit 5 for selecting one of signals clki. Circuit 5 takes as an input all or part of signals clki and outputs a signal clk-sel corresponding to one of the signals clki that it receives. Circuit 5 also receives a control signal determining to which of the signals clki received by circuit 5 is equal to the signal clk-sel available on the output of circuit 5.

Device 1 comprises a phase-locked loop 2 or PLL.

Phase-locked loop 2 is configured to deliver a signal sigF which varies according to the difference between a frequency of signal clk-sel, that is, of the selected signal clki, and a set point frequency of this signal clk-sel. In other words, signal sigF has a value modified by the difference between the frequency of signal clk-sel and the set point frequency of signal clk-sel. More exactly, in phase-locked loop 2, the frequency of signal clk-sel is divided to obtain a periodic signal clkfb at a lower frequency, and signal sigF varies according to the frequency difference between signal clkfb and a clock signal clkref. The set point frequency of signal clk-sel is then determined by a factor by which the frequency of signal clk-sel is divided to obtain signal clkfb and by a frequency of signal clkref. As an example, signal sigF is a voltage, for example, positive and referenced to a reference potential, typically the ground, applied to a node or rail 3. Signal sigF is for example available on, or delivered by, an output 203 of phase-locked loop 2.

Phase-locked loop 2 receives signal clk-sel, for example, on an input 201.

Phase-locked loop 2 also receives clock signal clkref, for example, on an input 202. Preferably, signal clkref is obtained from a reference clock signal, for example, a reference clock signal delivered by a quartz, so that its frequency is as accurate as possible. As an example, signal clkref is obtained at the output of a frequency divider configured to deliver signal clkref at a frequency divided with respect to that of the reference clock signal. According to another example, signal clkref is confounded with the reference clock signal, and is for example directly delivered by a quartz.

Although, generally, signal clkref is identical whatever the signal clki selected by circuit 5, signal clkref may have a different frequency according to the signal clki selected by circuit 5. Signal clkref is for example obtained at the output of a programmable frequency divider, based on the reference clock signal, and the factor by which the frequency of the reference clock signal is divided to obtain signal clkref for example depends on the signal clki selected by circuit 5.

According to an embodiment, phase-locked loop 2 comprises:

a frequency divider circuit, or frequency divider, 205 (block Mdiv in FIG. 1), adjustable according to the signal clki selected by circuit 5 and delivered to phase-locked loop 2;

a phase frequency detector, or phase comparator, 207 (block PFD in FIG. 1);

a charge pump 209; and a loop filter 211.

Frequency divider 205 is configured to divide the frequency of signal clk-sel by a number Mi which is a function of the signal clki selected by circuit 5. The set point frequency of this signal clki selected by circuit 5 is then equal to Mi times the frequency of signal clkref.

Frequency divider 205 receives signal clk-sel on an input 2051, and delivers signal clkfb on an output 2052. The frequency of signal clkfb at the output of divider 205 is equal to that of signal clk-sel divided by the corresponding number Mi.

Phase comparator 207 is configured to compare the phase of signal clkfb with that of signal clkref. For example, phase comparator 207 is configured to deliver a first binary signal UP indicating, for example, by a high state, when signal clkfb is phase-lagged with respect to clock signal clkref and a second binary signal DW indicating, for example, by a high state, when signal clkfb is phase-advanced with respect to signal clkref. Signal clkfb is for example received by an input 2071 of phase comparator 207. Signal clkref is for example received by an input 2072 of phase comparator 207. Signals UP and DW are for example delivered by outputs, respectively, 2074 and 2073, of phase comparator 207.

As an example, phase comparator 207 is similar or identical to the phase comparator illustrated in Figure number 1.9.a of the thesis entitled "Contribution pour l'amélioration de la robustesse et du bruit de phase des synthétiseurs de fréquence," submitted by M. Houdebine in March 2007.

Charge pump 209 is controlled by phase comparator 207, for example, by binary signals UP and DW. Charge pump 209 is configured to generate, based on signals UP and DW, a signal Δ (delta) which varies according to the phase difference between signals clkref and clkfb, that is, signal Δ is adjusted according to this phase difference. As an example, signal Δ is a voltage, for example, positive and referenced to node 3, that is, to ground. Signals UP and DW are for example received by inputs, respectively 2092 and 2091, of charge pump 209, signal Δ being for example delivered by an output 2093 of charge pump 209.

According to an embodiment, charge pump 209 comprises, between a node or rail 4 of application of a power supply voltage Vdd, for example, positive and referenced to the ground potential of node 3, a current source 2095, a switch SW1, a switch SW2, and a current source 2097 series-connected, in this order. For example, current source 2095 couples node 4 to switch SW1, switch SW1 couples current source 2095 to the output 2093 of circuit 209, switch SW2 couples output 2093 to current source 2097, and current source 2097 couples switch SW2 to node or rail 3. The two current sources 2095 and 2097 deliver a same current or, in other words, current source 2095 delivers a current having the same value as the current delivered by current source 2097. Switches SW1 and SW2 are controlled by the output signals of phase comparator 207.

According to an embodiment, charge pump 209 is configured to supply a positive current on its output 2093 when signal clkfb is phase-lagged with respect to signal clkref, and to draw a positive current from its output 2093 when signal clkfb is phase-advanced with respect to signal clkref. According to an embodiment, taking the example of a charge pump 209 described hereabove and illustrated in FIG. 1, switch SW1 is controlled from signal UP so that switch SW1 is on when signal UP indicates that signal clkfb is phase-lagged with respect to signal clkref, and off otherwise. Further, switch SW2 is controlled from signal DW, so that switch SW2 is on when signal DW indicates that signal clkfb is phase-advanced with respect to signal clkref, and off otherwise. Thus, when signal clkfb is phase-lagged with respect to signal clkref, source 2095 supplies current to the output 2093 of charge pump 209, and, conversely, when signal clkfb is phase-advanced with respect to signal clkref, source 2097 draws current from the output 2093 of charge pump 209.

Filter 211 is configured to deliver signal sigF based on the signal Δ delivered by charge pump 209, for example, from the current drawn from or supplied by the output 2093 of charge pump 209. The output 2093 of charge pump 209 is coupled, for example, connected, to an input 2111 of filter 211. Signal sigF is for example available on an output 2112 of filter 211.

As an example, filter 211 comprises a capacitive element C1 coupling input 2111 to node 3, and, in parallel with capacitive element C1, a series association of a resistor R1 and of a capacitive element C2 coupling input 2111 to node 3, output 2112 being coupled, preferably connected, to the input 2111 of filter 211.

Thus, in this embodiment where charge pump 209 delivers a positive current when signal UP indicates that signal clkfb is phase-lagged on signal clkref, and draws a positive current when signal DW indicates that signal clkfb is phase-advanced on signal clkref, the value of signal sigF increases, respectively decreases, when signal clkfb is phase-lagged, respectively advanced, with respect to signal clkref. Signal sigF, that is, its value, thus effectively varies according to a difference between the frequency of signal clk-sel and the set point frequency of signal clk-sel.

According to another embodiment, charge pump 209 is configured to draw a positive current from its output 2093 when signal clkfb is phase-lagged with respect to signal clkref, and to supply a positive current on its output 2093 when signal clkfb is phase-advanced with respect to signal clkref. According to this embodiment, taking the example of a charge pump 209 described hereabove and illustrated in FIG. 1, switch SW1 is controlled from signal DW, so that switch SW1 is on when signal DW indicates that signal clkfb is phase-advanced with respect to signal clkref, and off otherwise. Further, switch SW2 is controlled from signal UP, so that switch SW2 is on when signal UP indicates that signal clkfb is phase-lagged with respect to signal clkref, and off otherwise. In this embodiment, the value of signal sigF decreases, respectively increases, when signal clkfb is phase-lagged, respectively advanced, with respect to signal clkref. Signal sigF, that is, its value, thus effectively varies according to a difference between a frequency of signal clk-sel and the set point frequency of signal clk-sel.

In addition to phase-locked loop 2, device 1 comprises as many clock signal generation circuits 4$i$ as there are signals clki generated by device 1, that is, N circuits 4$i$ in this example. In other words, for each of the clock signals clki generated by device 1, the latter comprises a corresponding circuit 4$i$. In FIG. 1, only three circuits 41, 4$i$, and 4N are shown to avoid overloading the drawing.

Each circuit 4$i$ comprises a ring oscillator 5$i$ (blocks ROi in FIG. 1). Each oscillator 5$i$ is configured to deliver the corresponding signal clki. Oscillators 5$i$ are for example different from one another, so that the frequencies of signals clki are different from one another.

Although this is not shown in FIG. 1, each oscillator 5$i$ comprises, for example, an odd number of series-connected logic gates, to form a loop. Each of these logic gates is configured to invert the state of a binary signal that it receives, that is, to deliver a binary signal in the low state when it receives the binary signal in the high state, and to deliver a binary signal in the high state when it receives the binary signal in the low state. Due to the propagation times in these logic gates, the binary signal available on the output of each of these gates starts oscillating between the low state and the high state, at a frequency determined by the propagation times of the logic gates forming the ring oscillator. This signal is for example the signal clki delivered by oscillator 5$i$.

In each circuit 4$i$, oscillator 5$i$ is connected to a node 400$i$. Node 400$i$ is configured to receive a current Isupplyi.

More particularly, in each circuit 4$i$, oscillator 5$i$ draws a current Ii from node 400$i$ for its electric power supply. For example, oscillator 5$i$ is connected between node 400$i$ and node 3, and is electrically powered with the voltage available between these nodes 400$i$ and 3.

Each circuit 4$i$ is configured to selectively operate either in non-controlled mode, or in controlled mode. When a circuit 4$i$ operates in controlled mode, circuit 5 selects the signal clki of this circuit 4$i$, or, in other words, signal clk-sel corresponds to the signal clki of this circuit 4$i$. When a circuit 4$i$ operates in controlled mode, the frequency of its signal clki is controlled by phase-locked loop 2. Although a single one of circuits 4$i$ at a time can operate in controlled mode, all circuits 4$i$ may simultaneously operate in non-controlled mode.

More particularly, each circuit 4$i$ is configured to supply, to node 400$i$, a compensation current Icompi determined by signal sigF, only when it operates in controlled mode. In other words, each circuit 4$i$ is configured to supply compensation current Icompi to node 400$i$ when it operates in controlled mode, and not to supply this current Icompi to node 400$i$ when it operates in non-controlled mode. The value of current Icompi depends on the value of signal sigF. The current Icompi supplied to node 400$i$ may be positive or negative according to the value of signal sigF.

In device 1, any of circuits 4$i$ may be selected to operate in controlled mode, without for a distinct phase-locked loop to be provided for each circuit 4$i$. This enables to decrease the bulk and the power consumption of device 1 with respect to a similar device where each circuit 4$i$ would be associated with a distinct phase-locked loop.

When a circuit 4$i$ operates in non-controlled mode, the current Ii received by its oscillator 5$i$ is equal to current Isupplyi, whereby the frequency of the signal clki that it delivers is determined by the value of current Isupplyi. It will be within the abilities of those skilled in the art to determine the structure of the oscillator 5$i$ of each circuit 4$i$, as well as the value of current Isupplyi, so that, in non-controlled mode, the frequency of the signal clki delivered by oscillator 5$i$ is equal to its set point frequency, that is, Mi times the frequency of the signal clkref corresponding to this signal clki.

However, when this circuit 4$i$ operates in controlled mode, the current Ii received by its oscillator 5$i$ depends on the current Icompi supplied to node 400$i$, and thus on the value of voltage sigF, which enables to control the frequency of signal clki due to voltage sigF. The frequency of the signal clki supplied by circuit 4$i$ in controlled mode is then equal to its set point value with more accuracy than when this circuit 4$i$ is in non-controlled mode. In particular, each circuit 4$i$ is configured, when it operates in controlled mode, to decrease the value of current Icompi when the frequency of signal clki is greater than its set point value, and to increase the value of current Icompi when the frequency of signal clki is smaller than its set point value. In other words, each circuit 4$i$ is configured, based on signal sigF, to decrease current Icompi when signal clkfb is phase-advanced with respect to signal clkref, and to increase current Icompi when signal clfkb is phase-lagged with respect to signal clkref.

In the circuit 4$i$ operating in controlled mode, a modification of current Icompi causes a corresponding modification of the current Ii received by the oscillator 5$i$ of this circuit 4$i$, which results in a corresponding modification of the frequency of the signal clki delivered by this oscillator 5$i$. For example, a decrease in current Icompi causes a decrease in current Ii, and thus a decrease in the frequency of signal clki.

According to an embodiment, each circuit 4$i$ comprises a node 404$i$ coupled to node 400$i$ by a switch SW3$i$, so that, when switch SW3$i$ is on, current Icompi is delivered to node 400$i$ from node 404$i$ (controlled operation) and, conversely, when switch SW3$i$ is off, node 400$i$ is isolated from node 404$i$ and current Icompi is not delivered to node 400$i$, from node 404$i$ (non-controlled operation). In alternative embodiments, switch SW3$i$ may be omitted, by providing other means, for example, other switches, to selectively supply current Icompi to node 400$i$ according to the state of these switches. For example, controlled switches may be provided during the non-controlled operation so that current Icompi is forced to a zero value.

According to an embodiment, each circuit 4i comprises a current source 402i configured to supply current Isupplyi to node 400i. As an example, each current source 402i couples node 4 to the corresponding node 400i. According to an embodiment, the current source 402i of each circuit 4i is configured so that the current Isupplyi that it supplies node 400i with is equal to Ki times a reference current Iref, Ki being a different factor for each circuit 4i. Thus, the frequency of the signal clki delivered by each circuit 4i, when this circuit 4i is in non-controlled mode, is at least partly determined by the factor Ki of this circuit 4i and by current Iref.

According to an embodiment, each circuit 4i comprises a circuit 6i having node 404i as an output, circuit 6i being configured to supply current Icompi to node 404i.

According to an embodiment, each circuit 4i, and more particularly its circuit 6i, comprises a circuit 7i configured to supply node 404i with a current I+i determined by signal sigF, and a circuit 8i configured to draw a current I−i from node 404i. Current Icompi is then equal to current I+i minus current I−i.

In an embodiment where both currents I−i and I+i are positive, an increase in the current I−i drawn from node 400i causes a decrease in the frequency of signal clki, and an increase in the current I+i supplied to node 400i causes an increase in the frequency of signal clki.

In an alternative embodiment where both currents I−i and I+i are negative, an increase (in absolute value) in the current I−i drawn from node 400i causes an increase in the frequency of signal clki, and an increase (in absolute value) in the current I+i supplied to node 400i causes a decrease in the frequency of signal clki.

According to an embodiment, the circuit 7i of each circuit 4i is configured so that current I+i is equal to Ki times B times a current I', B being a factor determined by the value of signal sigF. Current I' is identical for all circuits 4i. For example, for any given value of signal sigF, factor B is identical whatever the considered circuit 4i.

According to an embodiment, the circuit 8i of each circuit 4i is configured so that current I−i is equal to Ki times A times a current I". Current I" is for example proportional to current Iref.

For each circuit 4i, the value of factor A is determined so that the frequency of signal clki is different from its target value when current Icompi is equal to current I−i only (current I+i equal to zero), and so that the frequency of signal clki can be taken back to its target value when current Icompi is equal to the difference of currents I+i and I−i and current I+i is a function of non-zero signal sigF. Thus, when currents I−i and I+i are positive, factor A is determined so that the frequency of signal clki is smaller than its set point frequency when the current Icompi supplied to node 400i is equal to current I−i only. Conversely, when currents I+i and I−i are negative, factor A is determined so that the frequency of signal clki is greater than its set point frequency when the current Icompi supplied to node 400i is equal to current I−i only.

Further, the determination of factor A is preferably performed by taking into account the possible operating conditions of device 1, that is, the possible variations of its operating temperature and of its power supply voltage Vdd, and the influence of these variations on the frequency of signal clki when current Icompi is zero (non-controlled). When the value of factor A is determined in a phase of design of device 1, that is, before the manufacturing thereof, the influence of the manufacturing variations on the frequency of signal clki when current Icompi is zero is also taken into account.

According to an embodiment, the value of factor A is determined during a phase of design of device 1, taking into account PVT ("Process, Voltage, Temperature") variations. Preferably, in this embodiment, the value of factor A is the same for all circuits 4i. As an example, in such an embodiment, when currents I+i and I−i are positive, the maximum frequency that signal clki can take with variations PVT when current Icompi is zero is observed. Starting from signal clki at this maximum frequency, and while current I+i is zero, the value of factor A, and thus of current I−i, is progressively increased until the frequency of signal clki becomes smaller than its set point frequency. This value of signal A will then be used when a circuit 4i operates in controlled mode. According to another example, in such an embodiment, when currents I+i and I−i are negative, the minimum frequency that signal clki can take with PVT variations when current Icompi is zero is observed. Starting from signal clki at this minimum frequency, and while current I+i is zero, the value of factor A, and thus of current I−i (in absolute value) is progressively increased until the frequency of signal clki becomes greater than its set point frequency. This value of signal A will then be used when a circuit 4i operates in controlled mode.

According to another embodiment, a phase of calibration of each circuit 4i is provided to determine the value of the factor A of each circuit 4i, taking into account the possible variations of temperature and of voltage Vdd, the influence of the manufacturing variations being suppressed due to this calibration phase. In such an embodiment, the value of factor A differs between two circuits 4i. Each circuit 8i is then configurable to vary the value of the factor A of this circuit. Further, the maximum influence of the variations of temperature and of voltage Vdd on the frequency of signal clki, that is, the worst possible deviation of the frequency of signal clki with the variations of temperature and of voltage Vdd, is known. The value of factor A is determined by taking into account the worst variations of the frequency of signal clki with the variations of temperature and of voltage Vdd, while current I+i is zero, so that the frequency of signal clki is different from its set point frequency when current Icompi is equal to current I−i only, and that this frequency of signal clki can be taken back to the set point frequency when current Icompi is equal to the difference of currents I−i and I+i.

As an example, in the case where currents I+i and I−i are positive, respectively negative, this means that the maximum, respectively minimum, frequency that signal clki can take with the variations of temperature and of voltage Vdd, when current Icompi is zero (non-controlled operation), is known. In the case where currents I+i and I−I are positive, respectively negative, the phase of calibration of a circuit 8i is then implemented as follows:

block 205 of phase-locked loop 2 is programmed to divide the frequency of the received signal clki by a number Mi' equal to number Mi decreased, respectively increased, by X % to take into account the worst influence of the variations of temperature and voltage Vdd on the frequency of signal clki. In other words, frequency divider 205 is reprogrammed during the calibration phase to take into account the variations of temperature and of the power supply voltage on the frequency of the selected signal clki, the value of factor A, and thus of current I−i (in absolute value), is progressively increased while current I+i is zero, preferably by resetting frequency divider 205 on a rising or falling edge of signal clkref (according to the direction of phase detector 205) at each step, that is, for each new value of factor A, a resetting of frequency divider 205 comprising, for example, resetting the outputs of the flip-flops forming it, and the final or calibrated value of factor A is determined when signal clkfb becomes phase-lagged (case where currents I+i and I−i are positive), respectively advanced (case where currents I+i and I−i are negative), with respect to signal clkref.

this final or calibrated value of factor A is then stored in a memory (not shown). During the controlled operation, circuit 8*i* is controlled so that factor A is at the calibrated value which has been determined during the calibration phase and the divider block 205 of the phase-locked loop is then programmed with number Mi, and not number Mi'.

As an example, this calibration phase may be implemented by a circuit (not shown) for controlling device 1, for example, a state machine, based on the signals UP and DW available at the output of the phase comparator 207 of phase-locked loop 2, to detect, due to these signals, when the frequency of signal clkfb, obtained by dividing the frequency of signal clki by Mi', is smaller, respectively greater, than the frequency of signal clkref. More exactly, signals UP and DW are used to detect when the frequency of signal clkfb becomes smaller, respectively greater, than the frequency of signal clkref. Preferably, this control circuit is also configured to control circuit 5. Preferably, this control circuit is also configured to control whether a circuit 4*i* is in controlled or non-controlled mode, for example, by controlling the switch SW3*i* of this circuit 4*i*.

As compared with a generator of a plurality of clock signals implemented by means of a plurality of RC oscillators, device 1 consumes less electric power, due to the fact that device 1 comprises no capacitive ramp generator. Device 1 is thus particularly well adapted to so-called "low-consumption" applications.

Device 1 has been described hereabove in the case where it is configured to generate N different signals clki. According to an embodiment, not claimed, device 1 is configured to generate a single clock signal, for example, signal clk1. In this case, device 1 is identical to that described in relation with FIG. 1, with the difference that it does not comprise circuits 42 to 4N, that is, circuits 4*i*, with i ranging from 2 to N, that it does not comprise circuit 5, and that signal clk1 is received by the input 201 of the phase-locked loop.

According to an embodiment, each circuit 7*i* comprises a current mirror comprising an input branch and at least one output branch associated with this input branch. Said at least one output branch is configured to supply current I+i. The input branch is controlled by signal sigF. For example, the input branch comprises a voltage-to-current converter controlled by the second signal. The input branch is configured so a current equal to B times current I' flows therein. According to an embodiment, this input branch is common to all circuits 7*i* or, in other words, one and the same input branch is shared by all circuits 7*i*. This particularly results from the fact that, to obtain the current I+i of a given circuit 7*i*, the current mirror of this circuit 7*i* is configured to multiply the current B*I' flowing through the common input branch by the factor Ki specific to this circuit 7*i*. The provision of such an input branch common to all circuits 7*i* enables to decrease the bulk and the power consumption of device 1 with respect to the case where each circuit 7*i* would comprise a distinct input branch.

According to an embodiment, preferably combined with the above embodiment, each circuit 8*i* comprises a current mirror comprising an input branch and at least one output branch associated with this input branch. Said at least one output branch is configured to deliver current I−i. The input branch is configured so that current I" flows therethrough. According to an embodiment, this input branch is common to all circuits 8*i*, or, in other words, one and the same input branch is shared by all circuits 8*i*. This particularly results from the fact that, to obtain the current I−i of a given circuit 8*i*, the current mirror of this circuit 8*i* is configured to multiply the current I" flowing through the common input branch by the product of the factors Ki and A specific to this circuit 8*i*. The provision of such an input branch common to all circuit 8*i* enables to decrease the bulk and the power consumption of device 1 with respect to the case where each circuit 8*i* would comprise a distinct input branch. It should be noted that, for an embodiment where the value of the factor A of each circuit 8*i* is calibrated, said at least one output branch of the current mirror is controllable to vary the value of factor A or, in other words, comprises a circuit controllable to vary the value of factor A.

It will be within the abilities of those skilled in the art to implement the previously-described circuits based on the above functional description of these circuits, for example, by means of current mirrors having ratios Ki of the current present in an input branch of the current mirror to the current supplied by one or a plurality of output branches of the current mirror which are associated with this input branch.

FIG. 2 schematically shows an embodiment of a circuit 8*i* of the device 1 of FIG. 1. In this example, circuit 8*i* is configured to allow the implementation of a calibration step such as previously described, and for the current I−i that it draws from node 404*i* (FIG. 1) to be positive.

Circuit 8*i* comprises a current mirror 805. The current mirror comprises an input branch 806 and an output branch 804.

Input branch 806 is configured so that current I" flows therethrough. As an example, input branch 806 comprises a current generator 807 configured to deliver current I", in series with a MOS ("Metal Oxide Semiconductor") transistor T2. For example, transistor T2 has an N channel and couples a terminal of generator 807 to node 3, the other terminal of generator 807 being coupled, preferably connected, to node 4.

According to an embodiment, the input branch 806 of the current mirrors 805 of circuits 8*i* is common to all circuits 8*i*. In other words, the current mirrors 805 of all circuits 8*i* share the same input branch 806.

The output branch 804 of current mirror 805 is configured to supply or generate current I−i, that is, to draw current I−i from the output of circuit 8*i*.

Branch 804 comprises a MOS transistor T1, with a channel of the same type as that of transistor T2. Transistor T1 is assembled as a mirror of transistor T2. In other words, the gates of transistors T1 and T2 are connected together, and to the drain of transistor T2. As an example, a first conduction terminal, for example, the source, of transistor T1 is coupled, preferably connected, to node 3 at the ground potential, and a second conduction terminal, for example, its drain, of transistor T1 is coupled to the output of circuit 8*i*.

Transistor T1 is configured to supply a copy of current I" multiplied by the product of factor Ki and of a factor Amax. In other words, transistor T1 is configured to supply a current equal to Amax*Ki*I". Still in other words, the ratio of the dimension ratio of transistor T1 to the dimension ratio of transistor T2 is equal to the product of the factors Ki and Amax of this circuit 8*i*.

In this embodiment, to allow the implementation of a calibration phase, circuit 8i further comprises a circuit 800 configured to decrease in controlled fashion the value of factor A with respect to its maximum value Amax. In other words, transistor T1 and circuit 800 are configured together to supply or generate, from current I", current I−i. Still in other words, the output branch 804 of current mirror 805 is controllable to vary the value of factor A. In this example, circuit 800 comprises a first terminal 801 coupled, preferably connected, to the second conduction terminal of transistor T1, and a second terminal 802 coupled, for example, connected, to the output of circuit 8i.

According to an embodiment, circuit 800 comprises, between its terminals 801 and 802, a plurality of MOS transistors, for example, with an N channel, series-connected to one another and to a switch SW5, the series-connected transistors having their gates connected to one another and to the gate of transistor T1. In the example illustrated in FIG. 2, circuit 800 comprises two transistors T3 and T4, transistor T4 being coupled to terminal 802 by switch SW5. According to this embodiment, circuit 800 further comprises a switch connected in parallel with each of the transistors T3, T4 of circuit 800. More particularly, in the shown example, circuit 800 comprises a switch SW6 connected in parallel with transistor T3 and a switch SW7 connected in parallel with transistor T4.

According to this embodiment of circuit 800, when switch SW5 is off, the current I−i in branch 804 is zero. However, when switch SW5 is on, this current I−i is equal to Ki*Amax/(n+1)*I", n being a factor determined by the number of on switches SW6, SW7. Indeed, the more the number of on switches SW6, SW7 decreases, the more the equivalent resistance of circuit 800 between these terminals 801 and 802 increases, and thus the more the value of factor n increases. The more the value of factor n increases, the more the value of factor A, here equal to Amax/(n+1), decreases, and thus the more the value of current I−i decreases. In other words, when the switch in parallel with one of the transistors of circuit 800 is off, this transistor ends up being in series with transistor T1, which causes a decrease in current I−i.

By controlling the off and on states of the switches of circuit 800, the value of factor A is thus varied, for example, during the previously-described calibration phase which is implemented to determine the value of factor A. As an example, during this calibration phase, the switches SW5, SW6, SW7 of circuit 800 are controlled from signals UP and DW (FIG. 1). For example, at a first step, switch SW5 is off and current I−i is zero, or, in other words, factor A is zero. At a second step, switch SW5 is on and all the other switches are off, and factor A then is at a non-zero minimum value. At third steps, to increase the value of factor A, the switches other than switch SW5 are turned on one after the others. Frequency divider 205 is preferably reset after each change of value of factor A, and signals UP and DW are used to determine the value of factor A for which signal clfkb becomes phase-lagged with respect to signal clkref. This value will then be used in controlled mode, by controlling the switches of circuit 800 in appropriate fashion.

An example where the transistors of circuit 800 are in series has been described herein. In another embodiment, not illustrated, it may be provided for current mirror 805 to comprise a plurality of output branches in parallel, each supplying a portion of current Amax*Ki*I". In this case, circuit 800 for example comprises one switch per output branch, so that the state of the switch of each output branch determines whether the portion of current Amax*Ki*I" supplied by this output branch contributes or not to current I−i. In other words, the output branches of the current mirror are controllable to vary the value of factor A.

The case of a circuit 8i adapted to the implementation of a calibration step for determining the value of factor A has been described hereabove. In the case where the value of factor A is determined on design of device 1 and where no calibration phase is provided to determine the value of the factor A of each circuit 8i, circuit 800 may be omitted, and factor Amax is then equal to the factor A determined on design of device 1.

The case of a circuit 8i for which the current I−i drawn from the output of circuit 8i is positive has been described hereabove. In the case where the current I−i drawn from the output of circuit 8i is negative, it may be provided for circuit 8i to comprise an additional P-channel MOS transistor current mirror. A first MOS transistor of this additional current mirror is in series with the output branch(es) of the current mirror 805 of circuit 8i, and a second MOS transistor of this additional current mirror is assembled as a mirror of the first transistor, between node 4 and the output of circuit 8i. As a variant, it may be provided to invert nodes 3 and 4 and the type of channel of each of the transistors of circuit 8i described hereabove in relation with FIG. 2.

FIG. 3 schematically shows an embodiment of a circuit 7i of the device 1 of FIG. 1. In this example, circuit 7i is configured so that the current I+i that it supplies node 404i with (FIG. 1) is positive, and to operate with a voltage sigF which increases, respectively decreases, when signal clkfb is phase-lagged, respectively advanced, with respect to signal clkref.

Circuit 7i comprises a current mirror 702. Current mirror 702 comprises an input branch 703, and an output branch 701 associated with input branch 703. The output branch is configured to supply current I+i.

Input branch 703 is controlled by voltage sigF. More particularly, branch 703 is configured so that the current I700 that it conducts is equal to B times current I'.

In this embodiment, input branch 703 comprises a voltage-to-current converter 700 controlled by signal sigF. In this example, the voltage-to-current converter comprises a MOS transistor T7, in this example with an N channel, in series with a resistor R2 between two terminals 704 and 705 of converter 700. Transistor T7 is controlled by signal sigF or, in other words, the gate of transistor T7 receives signal sigF. Transistor T7 has a first conduction terminal, for example, its source, coupled to terminal 705 and a second conduction terminal, for example, its drain, coupled to terminal 704. More exactly, in the example of FIG. 3, the source of transistor T7 is connected to a terminal 706 of a resistor R2, another terminal of resistor R2 being connected to terminal 705. The terminal 705 of converter 700 is coupled, preferably connected, to node 3, the terminal 704 of converter 700 being coupled to node 4.

Input branch 703 further comprises a MOS transistor T6, in this example, with a P channel, in series with converter 700 between nodes 3 and 4. Transistor T6 couples the terminal 704 of converter 700 to node 4.

According to an embodiment, the input branch 703 of the current mirrors 702 of circuits 7i is common to all circuits 7i. In other words, the current mirrors 702 of all circuits 7i share the same input branch 703.

The output branch 701 associated with input branch 703 is configured to supply current I+i from the current of the I700. More exactly, branch 701 is configured to supply a copy of current I700 multiplied by factor Ki, so that current I+i flows through branch 701. Thus, branch 701 comprises a MOS transistor T5. Transistor T5 has a channel of the same type as transistor T6. Transistor T5 is mirror-assembled with transistor T6. In other words, the gate of transistor T5 is connected to the gate of transistor T6, and the gate of transistor T6 is connected to the drain of transistor T6. A conduction terminal of transistor T5, for example, its source, is connected to node 4, and another conduction terminal of transistor T5, for example, its drain, is coupled, for example, connected, to the output of circuit 7i. The ratio of the dimension ratio of transistor T5 to the dimension ratio of transistor T6 is equal to factor Ki.

In the above-described circuit example, when voltage sigF increases, the voltage across resistor R2, that is, the voltage on terminal 706, increases. This results in an increase in the current through resistor R2, and thus an increase of current I700 or, in other words, of the value of factor B. This causes a corresponding increase of current I+i.

The case where current mirror 702 comprises a single output branch 701 has been described hereabove. In another example, not illustrated, it may be provided for current mirror 702 to comprise a plurality of output branches, or a plurality of current copies, each output branch of the mirror then supplying a portion of current I+i.

An example of a circuit 8i configured to supply positive current I+i and to operate with voltage sigF, which increases, respectively decreases, when signal clkfb is phase-lagged, respectively advanced, with respect to signal clkref, has been described hereabove. In the case where current I+i is negative and where voltage sigF increases, respectively decreases, when signal clkfb is phase-lagged, respectively advanced, with respect to signal clkref, it is for example sufficient to invert, in the above-described circuit 8i, the nodes 3 and 4 and the type of channel of each transistor. More generally, it will be within the abilities of those skilled in the art to adapt the previously-described circuit 8i to the case where current I+i is negative and/or voltage sigF increases, respectively decreases, when signal clkfb is phase-lagged, respectively advanced, with respect to signal clkref.

Thus, in the present disclosure, clock signals clk1, . . . , clki, . . . , clkN are generated by the implementation of the following steps:

selecting one of signals clki by means of circuit 5;

delivering, by means of phase-locked loop 2, a signal sigF varying according to a difference between the frequency of the signal clkfb obtained by frequency division of the selected signal clki and the frequency of reference clock signal clkref;

for each of clock signals clk1, . . . , clki, . . . , clkN, supplying a current Isupply1, . . . , Isupplyi, IsupplyN to a node 4001, . . . , 400i, . . . , 400N of a corresponding circuit 41, . . . , 4i, . . . , 4N, comprising a ring oscillator 51, . . . , 5i, . . . , 5N connected to node 4001, . . . , 400i, . . . , 400N and delivering clock signal clk1, . . . , clki, . . . , clkN; and for the circuit 4i delivering the selected signal clki, supplying, selectively, that is, only during a controlled operating phase of this circuit 4i, the node 400i of this circuit 4i with a compensation current Icomp1, . . . , Icompi, . . . , IcompN determined by signal sigF.

Embodiments and variants of device 1 and of circuits forming it have been described hereabove in relation with FIGS. 1, 2, and 3. It will be within the abilities of those skilled in the art to provide other implementations of device 1 and of the circuits forming it based on the given functional description. For example, it will be within the abilities of those skilled in the art to provide other implementations of phase-locked loop 2, of circuits 6i, 7i, 8i, 800, and/or 700 than those previously described.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

A device for generating a plurality of first clock signals (clk1, clki, clkN), the device (1) may be summarized as including first circuits (41, 4i, 4N), each comprising a ring oscillator (51, 5i, 5N) configured to deliver one of said plurality of first clock signals (clk1, clki, clkN), the oscillator being connected to a first node (4001, 400i, 400N) configured to receive a first current (Isupply1, Isupplyi, IsupplyN), a circuit (5) configured to receive the first clock signals (clk1, clki, clkN) and to deliver a first clock signal (clk-sel) selected from among the first clock signals (clk1, clki, clkN); and a phase-locked loop (2) configured to deliver a second signal (sigF) varying according to a difference between a frequency of the first selected clock signal and a set point frequency determined by a frequency of a third signal which is a clock signal (clkref) received by the phase-locked loop, wherein each first circuit (41, 4i, 4N) is configured to deliver to the first node a compensation current (Icomp1, Icompi, IcompN) determined by the second signal (sigF), when this first circuit delivers the first selected clock signal and this first circuit operates in a mode controlled by the phase-locked loop.

Each first circuit (41, 4i, 4N) may include: a first current source (4021, 402i, 402N) configured to supply the first current (Isupply1, Isupplyi, IsupplyN) to the first node (4001, 400i, 400N); a second node (4041, 404i, 404N) coupled to the first node (4001, 400i, 400N); a second circuit (71, 7i, 7N) configured to supply, to the second node (4041, 404i, 404N), a second current (I+1, I+i, I+N) determined by the second signal (sigF); and a third circuit (81, 8i, 8N) configured to draw a third current (I−1, I−i, I−N) from the second node.

In each first circuit (41, 4i, 4N): the first current source (4021, 402i, 402N) may be configured so that the first current (Isupply1, Isupplyi, IsupplyN) is equal to Ki times a reference current Iref; the second circuit (71, 7i, 7N) may be configured so that the second current (I+1, I+i, I+N) is equal to Ki times B times a fourth current (I') identical for all the first circuits, B being a factor determined by the second signal (sigF); and the third circuit (81, 8i, 8N) may be configured so that the third current (I−1, I−i, I−N) is equal to Ki times A times a fifth current (I") identical for all the first circuits (41, 4i, 4N) and proportional to reference current Iref.

Each third circuit (81, 8i, 8N) may include a current mirror (805) including an input branch (806) and at least one output branch (804) associated with said input branch, said at least one output branch being configured to supply the third current (I−1, I−i, I−N).

In each third circuit (81, 8i, 8N), the input branch (806) of said current mirror (805) may include a generator (807) of the fifth current (I").

The input branch (806) of said current mirror (805) of each third circuit (81, 8i, 8N) may be common to all the third circuits (81, 8i, 8N).

In each third circuit (81, 8i, 8N), said at least one output branch (804) may include a circuit (800) controllable to modify a value of factor A.

Each second circuit (71, 7i, 7N) may include a current mirror (702) including an input branch (703) and at least one output branch (701) associated with said input branch, said at last one output branch being configured to supply the second current (I+1, I+i, I+N).

In each second circuit (71, 7i, 7N), said input branch (703) may be controlled by the second signal (sigF) and may be configured so that a sixth current (I700) equal to B times the fourth current (I') flows therein.

In each second circuit (71, 7i, 7N), said input branch (703) may include a voltage-to-current converter (700) controlled by the second signal (sigF).

The voltage-to-current converter (700) may include a transistor (T7) in series with a resistor (R2), said transistor (T7) being controlled by the second signal (sigF).

The input branch (701) of the current mirrors (702) of the second circuits (71, 7i, 7N) may be common to all the second circuits.

The phase-locked loop (2) may include: a frequency divider (205) programmable according to the first selected signal (clk1, clki, clkN) and configured to receive the first selected signal and to deliver a periodic signal (clkfb) at a frequency divided with respect to a frequency of the first selected signal; a phase comparator (207) configured to deliver a first binary signal (UP) indicating when the periodic signal (clkfb) is phase-lagged with respect to the second clock signal (clkref) and a second binary signal (DW) indicating when the periodic signal (clkfb) is phase-advanced with respect to the second clock signal (clkref); a charge pump (209) controlled by the first and second binary signals (UP, DW) and configured to deliver a signal (Δ) varying according to the phase difference between the periodic signal (clkfb) and the second clock signal (clkref); and a filter (211) configured to deliver the second signal (sigF) based on the signal (Δ) delivered by the charge pump (209).

Each first circuit (41, 4i, 4N) may include: a first current source (4021, 402i, 402N) configured to supply the first current (Isupply1, Isupplyi, IsupplyN) to the first node (4001, 400i, 400N); a second node (4041, 404i, 404N) coupled to the first node (4001, 400i, 400N); a second circuit (71, 7i, 7N) configured to supply, to the second node (4041, 404i, 404N), a second current (I+1, I+i, I+N) determined by the second signal (sigF); and a third circuit (81, 8i, 8N) configured to draw a third current (I–1, I–i, I–N) from the second node, wherein, in each first circuit (41, 4i, 4N): the first current source (4021, 402i, 402N) is configured so that the first current (Isupply1, Isupplyi, IsupplyN) is equal to Ki times a reference current Iref; the second circuit (71, 7i, 7N) is configured so that the second current (I+1, I+i, I+N) is equal to Ki times B times a fourth current (I') identical for all the first circuits, B being a factor determined by the second signal (sigF); and the third circuit (81, 8i, 8N) is configured so that the third current (I–1, I–i, I–N) is equal to Ki times A times a fifth current (I") identical for all the first circuits (41, 4i, 4N) and proportional to reference current Iref, and wherein, in each third circuit (81, 8i, 8N), said at least one output branch (804) comprises a circuit (800) controllable to modify a value of factor A.

A method for generating a plurality of first clock signals (clk1, clki, clkN) may be summarized as including selecting, by means of a selection circuit (5), one of the first signals; delivering, by means of a phase-locked loop (2), a second signal (sigF) varying according to a difference between the frequency of the first selected signal and a set point frequency of the first selected signal; for each of said one or a plurality of first clock signals (clk1, clki, clkN), supplying a first current (Isupply1, Isupplyi, IsupplyN) to a first node (4001, 400i, 400N) of a corresponding first circuit (41, 4i, 4N), each first circuit (41, 4i, 4N) comprising a ring oscillator (51, 5i, 5N) connected to the first node (4001, 400i, 400N) and delivering one of said first clock signals (clk1, clki, clkN); and supplying to the first node (4001, 400i, 400N) of the first circuit delivering the first selected signal, by means of said first circuit, a compensation current determined by the second signal (sigF), only when said first circuit operates in a mode controlled by the phase-locked loop (2).

The method may be implemented by the device (1) according to claim 1.

The method may be implemented by the device (1) according to claim 14, including, for each first circuit (4i), a determination of a calibrated value of the factor A of the third circuit (8i) of said first circuit (4i), the determination of the calibrated value including: selecting, by means of the selection circuit (5), the first clock signal (clki) of said first circuit (4i); reprogramming the frequency divider (205) to take into account the variations of the temperature and of the power supply voltage of the device (1) on the frequency of the first selected clock signal (clk-sel); drawing the third current (I–i) from the first node (400i) and increasing the value of factor A by controlling said at least one output branch (804) of the third circuit (8i); and for each value of factor A, resetting the frequency divider (205) and determining whether the periodic signal (clkfb) is phase advanced or lagged with respect to the second clock signal (clkref) based on the first and second binary signals (UP, DW), the calibrated value of factor A being the first value of factor A for which: the periodic signal (clkfb) becomes phase-lagged with respect to the second signal (clkref) in a case where the second and third currents (I+i, I–i) are positive in controlled mode; or the periodic signal (clkfb) becomes phase-advanced with respect to the second signal (clkref) in a case where the second and third currents (I+i, I–i) are negative in controlled mode.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device for generating a plurality of first clock signals, the device comprising:
   a plurality of first circuits, each of the first circuits including a ring oscillator configured to deliver one of the plurality of first clock signals, the ring oscillator being coupled to a first node configured to receive a first current, each of the first circuits including:
      a first current source configured to supply the first current to the first node;
      a second node coupled to the first node;
      a second circuit configured to supply, to the second node, a second current determined by the second signal; and
      a third circuit configured to draw a third current from the second node;
   a signal selection circuit configured to receive the first clock signals and to deliver a first clock signal selected from among the first clock signals; and a phase-locked loop configured to deliver a second signal varying according to a difference between a frequency of the first selected clock signal and a set point frequency determined by a frequency of a third signal which is a clock signal received by the phase-locked loop.

2. The device according to claim 1,
wherein each first circuit is configured to deliver to the first node a compensation current determined by the second signal, when the first circuit delivers the first selected clock signal and the first circuit operates in a mode controlled by the phase-locked loop.

3. The device according to claim 2, wherein, in each first circuit:
the first current source is configured so that the first current is equal to Ki times a reference current;
the second circuit is configured so that the second current is equal to Ki times B times a fourth current that is identical for all the first circuits, B being a factor determined by the second signal; and
the third circuit is configured so that the third current is equal to Ki times A times a fifth current that is identical for all the first circuits and proportional to the reference current.

4. The device according to claim 3, wherein each third circuit includes a current mirror having an input branch and at least one output branch associated with the input branch, the at least one output branch being configured to supply the third current.

5. The device according to claim 4, wherein, in each third circuit, the input branch of the current mirror includes a generator of the fifth current.

6. The device according to claim 5, wherein the input branch of the current mirror of each third circuit is common to all the third circuits.

7. The device according to claim 3, wherein, in each third circuit, at least one output branch includes a circuit controllable to modify a value of factor A.

8. The device according to claim 3, wherein each second circuit includes a current mirror having an input branch and at least one output branch associated with the input branch, the at least one output branch being configured to supply the second current.

9. The device according to claim 8, wherein, in each second circuit, the input branch is controlled by the second signal and is configured so that a sixth current equal to B times the fourth current flows therein.

10. The device according to claim 8, wherein, in each second circuit, the input branch includes a voltage-to-current converter controlled by the second signal.

11. The device according to claim 10, wherein the voltage-to-current converter includes a transistor in series with a resistor, the transistor being controlled by the second signal.

12. The device according to claim 8, wherein the input branch of the current mirrors of the second circuits is common to all the second circuits.

13. The device according to claim 1, wherein the phase-locked loop includes:
a frequency divider programmable according to the first selected signal and configured to receive the first selected signal and to deliver a periodic signal at a frequency divided with respect to a frequency of the first selected signal;
a phase comparator configured to deliver a first binary signal indicating when the periodic signal is phase-lagged with respect to a second clock signal and a second binary signal indicating when the periodic signal is phase-advanced with respect to the second clock signal;
a charge pump controlled by the first and second binary signals and configured to deliver a signal varying according to a phase difference between the periodic signal and the second clock signal; and
a filter configured to deliver the second signal based on the signal delivered by the charge pump.

14. The device according to claim 13, wherein each first circuit includes:
the first current source configured to supply the first current to the first node;
the second node coupled to the first node;
the second circuit configured to supply, to the second node, the second current determined by the second signal; and
the third circuit configured to draw the third current from the second node,
wherein, in each first circuit:
the first current source is configured so that the first current is equal to Ki times a reference current Iref;
the second circuit is configured so that the second current is equal to Ki times B times a fourth current that is identical for all the first circuits, B being a factor determined by the second signal; and
the third circuit is configured so that the third current is equal to Ki times A times a fifth current that is identical for all the first circuits and proportional to reference current Iref,
and wherein, in each third circuit, at least one output branch comprises a circuit controllable to modify a value of factor A.

15. A method for generating a plurality of first clock signals, comprising:
selecting, by a selection circuit, one of the first clock signals;
delivering, by a phase-locked loop, a second signal varying according to a difference between a frequency of the first selected signal and a set point frequency of the first selected signal;
supplying, for each of said one or a plurality of first clock signals, a first current to a first node of a corresponding first circuit, each first circuit including:
a first current source configured to supply the first current to the first node;
a second node coupled to the first node;
a second circuit configured to supply, to the second node, a second current determined by a second signal; and
a third circuit configured to draw a third current from the second node; and
a ring oscillator coupled to the first node and delivering one of the first clock signals; and
supplying to the first node of the first circuit delivering the first selected signal, by the first circuit, a compensation current determined by the second signal, only when the first circuit operates in a mode controlled by the phase-locked loop.

16. The method according to claim 15 comprising, for each first circuit, a determination of a calibrated value of factor A of the third circuit of said first circuit, the determination of the calibrated value comprising:
selecting, by means of the selection circuit, the first clock signal of said first circuit;

reprogramming a frequency divider to take into account variations of temperature and of a power supply voltage of a device on the frequency of the first selected clock signal;

drawing the third current from the first node and increasing the value of factor A by controlling said at least one output branch of the third circuit; and for each value of factor A, resetting the frequency divider and determining whether a periodic signal is phase advanced or lagged with respect to a second clock signal based on first and second binary signals, the calibrated value of factor A being the first value of factor A for which:

the periodic signal becomes phase-lagged with respect to the second signal in a case where the second and third currents are positive in controlled mode; or the periodic signal becomes phase-advanced with respect to the second signal in a case where the second and third currents are negative in controlled mode.

17. A device for generating a plurality of first clock signals, the device comprising:

a first circuit including a ring oscillator configured to deliver one of the plurality of first clock signals, the ring oscillator being connected to a first node configured to receive a first current, the first circuit including:

a first current source configured to supply the first current to the first node;

a second node coupled to the first node;

a second circuit configured to supply, to the second node, a second current determined by a second signal; and a third circuit configured to draw a third current from the second node;

a signal selection circuit configured to receive the first clock signals and to deliver a first clock signal selected from among the plurality of first clock signals; and a phase-locked loop configured to deliver the second signal varying according to a difference between a frequency of the first selected clock signal and a set point frequency determined by a frequency of a third signal which is a clock signal received by the phase-locked loop, wherein the first circuit is configured to deliver to the first node a compensation current determined by the second signal, when the first circuit delivers the first selected clock signal and the first circuit operates in a mode controlled by the phase-locked loop.

18. The device according to claim 17, wherein, in the first circuit:

the first current source is configured so that the first current is equal to a first factor times a reference current;

the second circuit is configured so that the second current is equal to the first factor times a second factor times a fourth current, the second factor being a factor determined by the second signal; and the third circuit is configured so that the third current is equal to the first factor times a third factor times a fifth current that is proportional to the reference current.

19. The device according to claim 18, wherein the third circuit includes a current mirror having an input branch and at least one output branch associated with the input branch, the at least one output branch being configured to supply the third current.

20. The device according to claim 18, wherein the phase-locked loop includes:

a frequency divider programmable according to the first selected signal and configured to receive the first selected signal and to deliver a periodic signal at a frequency divided with respect to a frequency of the first selected signal;

a phase comparator configured to deliver a first binary signal indicating when the periodic signal is phase-lagged with respect to a second clock signal and a second binary signal indicating when the periodic signal is phase-advanced with respect to the second clock signal;

a charge pump controlled by the first and second binary signals and configured to deliver a signal varying according to a phase difference between the periodic signal and the second clock signal; and a filter configured to deliver the second signal based on the signal delivered by the charge pump.

* * * * *